United States Patent
Merchant et al.

(10) Patent No.: US 10,763,141 B2
(45) Date of Patent: Sep. 1, 2020

(54) NON-CONTACT TEMPERATURE CALIBRATION TOOL FOR A SUBSTRATE SUPPORT AND METHOD OF USING THE SAME

(71) Applicant: Applied Materials, Inc., Santa Clara, CA (US)

(72) Inventors: Niraj Merchant, San Francisco, CA (US); Lara Hawrylchak, Gilroy, CA (US); Mehran Behdjat, San Jose, CA (US); Dietrich Gage, San Jose, CA (US); Christopher Dao, San Jose, CA (US); Binh Nguyen, San Jose, CA (US); Michael P. Kamp, San Ramon, CA (US); Mahesh Ramakrishna, Bengaluru (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 637 days.

(21) Appl. No.: 15/461,952

(22) Filed: Mar. 17, 2017

(65) Prior Publication Data
US 2018/0269089 A1     Sep. 20, 2018

(51) Int. Cl.
*H01L 21/67*     (2006.01)
*G01J 5/00*      (2006.01)
(Continued)

(52) U.S. Cl.
CPC ...... *H01L 21/67248* (2013.01); *G01J 5/0003* (2013.01); *G01J 5/0007* (2013.01);
(Continued)

(58) Field of Classification Search
CPC .......... G01J 5/0003; G01J 5/0007; G01J 5/34; G01R 35/00; H01L 21/67103;
(Continued)

(56) References Cited

U.S. PATENT DOCUMENTS

| | | | | |
|---|---|---|---|---|
| 5,650,082 A | * | 7/1997 | Anderson | C23C 16/481 118/725 |
| 6,113,703 A | * | 9/2000 | Anderson | C23C 16/455 118/724 |

(Continued)

FOREIGN PATENT DOCUMENTS

JP    55113919 A  *  9/1980  ............ G01J 5/0846

OTHER PUBLICATIONS

PCT Notification of Transmittal of the International Search Report and the Written Opinion of the International Searching Authority for International Application No. PCT/US2018/021650; dated Jun. 20, 2018; 11 total pages.

*Primary Examiner* — Dana Ross
*Assistant Examiner* — Ket D Dang
(74) *Attorney, Agent, or Firm* — Patterson + Sheridan, LLP

(57) ABSTRACT

Embodiments of the disclosure relate to methods for measuring temperature and a tool for calibrating temperature control of a substrate support in a processing chamber without contact with a surface of the substrate support. In one embodiment, a test fixture with a temperature sensor is removably mounted to an upper surface of a chamber body of the processing chamber such that the temperature sensor has a field of view including an area of the substrate support that is adjacent to a resistive coil disposed in the substrate support. One or more calibration temperature measurements of the area of the substrate support are taken by the temperature sensor and simultaneously one or more calibration resistance measurements of the resistive coil are taken corresponding to each calibration temperature measurement. Temperature control of a heating element disposed in the substrate support is calibrated based on the calibration temperature and calibration resistance measurements.

10 Claims, 5 Drawing Sheets

(51) Int. Cl.
    *G01J 5/34* (2006.01)
    *G01R 35/00* (2006.01)
    *H01L 21/66* (2006.01)
    *H05B 1/02* (2006.01)
    *H05B 3/00* (2006.01)
(52) U.S. Cl.
    CPC ............... *G01J 5/34* (2013.01); *G01R 35/00* (2013.01); *H01L 21/67103* (2013.01); *H01L 22/20* (2013.01); *H05B 1/02* (2013.01); *H05B 1/0233* (2013.01); *H05B 3/0019* (2013.01)
(58) Field of Classification Search
    CPC ..... H01L 21/67248; H01L 22/20; H05B 1/02; H05B 1/0233; H05B 3/0019
    USPC ......... 219/444.1; 374/10, 31, 121; 62/259.2, 62/3.2; 118/725, 724, 720, 723 IR, 728, 118/715; 392/416, 418, 422, 424, 430
    See application file for complete search history.

(56) References Cited

U.S. PATENT DOCUMENTS

| | | | |
|---|---|---|---|
| 6,189,483 B1* | 2/2001 | Ishikawa | C23C 16/4405 118/723 E |
| 7,031,861 B2 | 4/2006 | Cardelius et al. | |
| 7,699,604 B2* | 4/2010 | Ito | C23C 16/46 432/200 |
| 7,942,969 B2* | 5/2011 | Riker | H01J 37/32357 118/715 |
| 2003/0080112 A1 | 5/2003 | Van Bilsen | |
| 2004/0184792 A1* | 9/2004 | Hamelin | C23C 16/4405 392/416 |
| 2007/0076780 A1* | 4/2007 | Champetier | G01J 5/0003 374/121 |
| 2007/0283709 A1* | 12/2007 | Luse | F25B 21/02 62/259.2 |
| 2010/0143579 A1* | 6/2010 | Narahara | C23C 16/4583 427/8 |
| 2011/0186229 A1* | 8/2011 | Hayashi | B05B 1/18 156/345.34 |
| 2012/0327970 A1 | 12/2012 | Haw | |
| 2014/0017848 A1* | 1/2014 | Ragay | H05B 3/0047 438/72 |
| 2014/0092935 A1 | 4/2014 | Lin et al. | |
| 2014/0356985 A1* | 12/2014 | Ricci | H01L 21/67109 438/11 |
| 2015/0219499 A1 | 8/2015 | Waldmann et al. | |
| 2016/0024651 A1* | 1/2016 | Faguet | C23C 16/452 118/724 |

* cited by examiner

NON-CONTACT TEMPERATURE CALIBRATION TOOL FOR A SUBSTRATE SUPPORT AND METHOD OF USING THE SAME

BACKGROUND

Field

Embodiments of the disclosure generally relate to methods for measuring temperature and a tool for calibrating temperature control of a substrate support in a processing chamber.

Description of the Related Art

During temperature-sensitive semiconductor processes such as annealing, the temperature of a semiconductor substrate is continually measured while the substrate is processed in a processing chamber. The existing solutions for measuring the temperature of the semiconductor substrates involve calibrating temperature control of heating elements disposed within a substrate support upon which the substrate is processed while contacting the surface of the substrate or the substrate support. These solutions can lead to the introduction of contamination into the processing chamber. For example, one of the solutions for calibrating the heating elements is the use of a calibration substrate having a number of thermocouples. However, copper within the thermocouples may undesirably be introduced as contamination into the chamber. While temporary workarounds for mitigating the risk of contaminants are possible, the use of thermocouples on a calibration substrate is generally undesirable.

Another existing solution for measuring the temperature of semiconductor substrates or substrate support involves the use of spring-loaded thermocouples. However, spring-loaded thermocouples have been found to have poor or inconsistent contact with the substrate or substrate support, and thus produce inaccurate temperature measurements.

Therefore, there is a need for an improved method for measuring temperature and apparatus for calibrating temperature control of a substrate support.

SUMMARY

Embodiments of the disclosure generally relate to methods for measuring temperature and a tool for calibrating temperature control of a substrate support in a processing chamber without contact with a surface of the substrate support. In one embodiment, a method for measuring temperature of a first substrate support disposed in a processing chamber is disclosed. A test fixture with a first temperature sensor is removably mounted to an upper surface of a chamber body of the processing chamber such that the first temperature sensor mounted to the test fixture has a field of view including a first area of the first substrate support that is adjacent to a first resistive coil disposed in the first substrate support. One or more calibration temperature measurements of the first area of the first substrate support are taken by the first temperature sensor and simultaneously one or more calibration resistance measurements of the first resistive coil are taken corresponding to each calibration temperature measurement. Temperature control of a first heating element disposed in the first substrate support is calibrated based on the calibration temperature and calibration resistance measurements.

Another embodiment of the disclosure provides a test fixture for measuring temperature of a substrate support disposed in a processing chamber. The test fixture includes a cover plate, one or more cooling channels thermally contacting the cover plate, a first opening and a second opening formed through the cover plate and a first non-contact temperature sensor mounted over the first opening and a second non-contact temperature sensor mounted over the second opening such that the first and the second non-contact temperature sensor are configured to measure temperature of surfaces below the cover plate through the openings of the cover plate. The cover plate is sized to cover an upper surface of a chamber body of the processing chamber when a lid of the processing chamber is open.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure generally relate to methods and a tool for calibrating temperature measurements of a substrate support in a processing chamber without contact with the surface of the substrate support. Specifically, a temperature sensor, such as but not limited to a pyrometer, is used to calibrate measurements of temperature. The pyrometer allows measurements of temperature without contact with the substrate support even at low temperatures, thus lowering any risk of contamination while preserving the accuracy and precision of the measurements. The measurements are then utilized to calibrate the control of a heating element disposed in the substrate support. While a pyrometer is selected as the temperature sensor in the particular embodiment described in the disclosure, it is understood that other non-contact temperature sensors such as infrared thermometers, infrared scanning systems, infrared thermal imaging cameras and the like, may also be selected. The principles underlying the methods and the tool described in this disclosure can be adapted to calibrate a wide variety of heating elements embedded in the substrate support.

Figure 1:
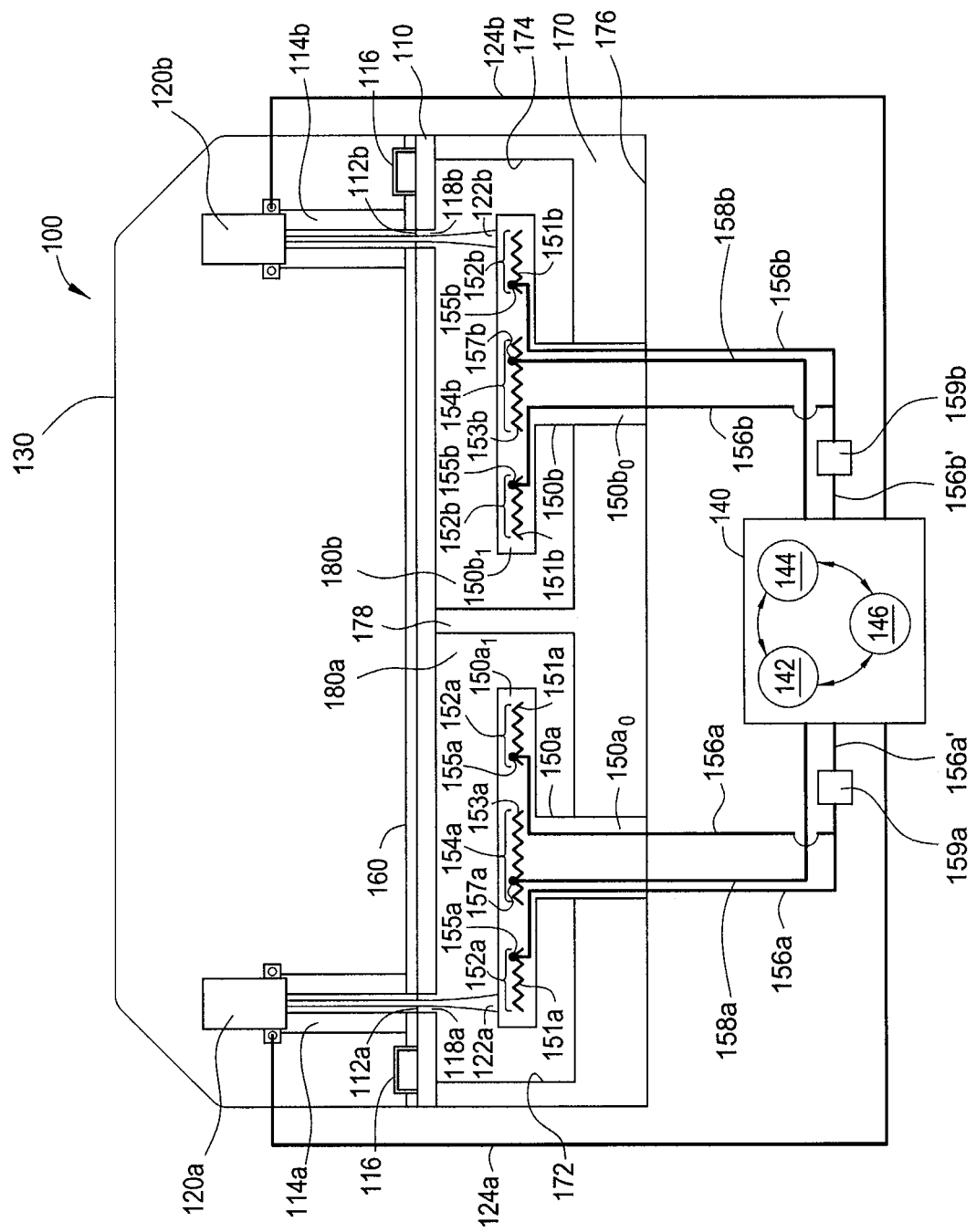
FIG. 1 is a schematic representation of a front view of a processing chamber having a test fixture for measuring temperature of a substrate support disposed in the processing chamber mounted thereon.

FIG. 1 is a schematic representation of a front view of a test fixture 110 disposed on a processing chamber 100 for measuring temperature of a substrate support disposed therein. Although the processing chamber 100 is illustrated with two substrate supports 150a, 150b, it is contemplated that the test fixture 110 may be adapted to measure the temperature of any number of substrate supports that may be disposed within the chamber 100 without contact with the surface of the substrate support. The processing chamber 100 may be configured to perform a semiconductor fabrication process such as etching, implanting, annealing, depositing, and plasma-treating a material on a substrate. In the embodiment shown in FIG. 1, the processing chamber 100 is adapted for annealing a substrate.

The processing chamber 100 has a chamber body 170 and a lid 130 coupled to the body 170. The lid 130 may be opened to expose the interior of the chamber body 170. The chamber body 170 has two sidewalls 172, 174 and a floor 176. The floor 176 couples the two sidewalls 172 and 174 together. The chamber body 170 has a dividing wall 178 that separates two processing volumes 180a, 180b defined within the chamber body 170. The substrate support 150a is disposed in the processing volume 180a while the substrate support 150b is disposed in the processing volume 180b has a substrate support 150b. Each of the substrate supports 150a, 150b may be centrally located within the respective processing volumes 180a, 180b. Each of the substrate supports 150a, 150b may optionally include a vacuum chuck or an electrostatic chuck. Each of the substrate supports 150a, 150b has a cylindrical base $150a_0$, $150b_0$ and a circular top surface $150a_1$, $150b_1$. The top surface $150a_1$, $150b_1$ is configured to support a substrate while processing, for example, at temperatures of up to 550 degrees Celsius. The top surface $150a_1$, $150b_1$ may be fabricated from a material that is compatible with the substrates to be processed thereon and with the processing environment in the chamber. Exemplary materials include quartz and ceramics such as aluminum oxide and aluminum nitride, which can withstand high temperatures.

Each of the substrate supports 150a, 150b has at least two controllable heating zones—a circular inner zone 154a, 154b and an annular outer zone 152a, 152b disposed around the inner zone 154a, 154b. Each of the inner zones 154a, 154b has an embedded heating element 153a, 153b. The heating element 153a, 153b may be a resistive heating element or other suitable heater. The temperature of each of the heating elements 153a, 153b is controlled by the supply of electric current from one or more power supplies (not shown). Each of the inner zones 154a, 154b also has an embedded thermocouple 157a, 157b for measuring the temperature of the substrate supports 150a, 150b adjacent to each of the heating elements 153a, 153b. Each of the thermocouples 157a, 157b is coupled to a controller 140 via a respective connecting wire 158a, 158b.

Each of the outer zones 152a, 152b has an embedded heating element 151a, 151b. In one embodiment, the embedded heating elements 151a, 151b may be a resistive heating element or other suitable heater. The temperature of each of the heating element 151a, 151b is controlled by the supply of electric current from one or more power supplies (not shown).

A resistive coil 155a, 155b is disposed in the substrate supports 150a, 150b adjacent to each heating elements 151a, 151b. Each of the resistive coils 155a, 155b is connected by a respective connecting wire 156a, 156b to an ohm-meter 159a, 159b to measure the resistances of the respective resistive coils 155a, 155b. The ohm-meters 159a, 159b are configured to measure the resistance in the resistive coils 155a, 155b and provide the resistance information to the controller 140 via a respective connecting wire 156a', 156b'.

The controller 140 includes a central processing unit (CPU) 142, a memory 144, and a support circuit 146. The controller 140 may be utilized to regulate the power applied to the heating elements 151a, 151b and 153a, 153b from the power supply (not shown), as well as receive information on the temperature of the heating elements 153a, 153b measured by the respective thermocouples 157a, 157b and the resistance of each of the resistive coils 155a, 155b measured by the respective ohm-meters 159a, 159b. The CPU 142 may be any form of general purpose computer processor that may be used in an industrial setting. The memory 144 may be random access memory, read only memory, floppy, or hard disk drive, or other form of digital storage. The support circuit 146 is conventionally coupled to the CPU 142 and may include cache, clock circuits, input/output systems, power supplies, and the like.

Figure 2:
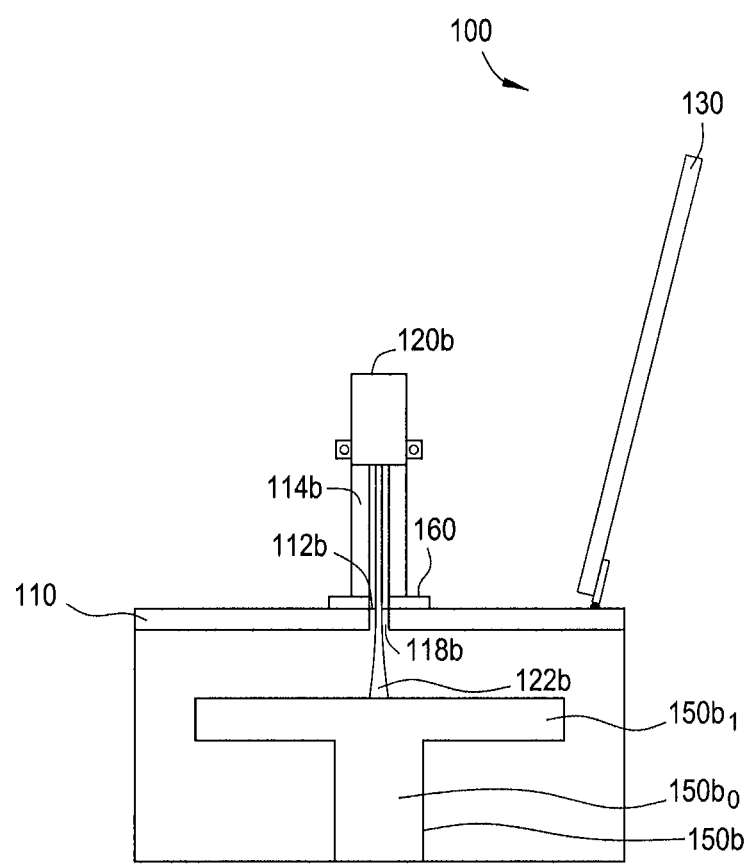
FIG. 2 is a schematic representation of a side view of the processing chamber having the test fixture mounted thereon.

FIG. 2 is a schematic representation of a side view of the test fixture 110 disposed on the processing chamber 100 for measuring temperature of a substrate support 150a, 150b without contact with the surface of the substrate support. During calibration, the lid 130 of the processing chamber 100 is lifted to an open position and the test fixture 110 is placed on top of the chamber body 170. The test fixture 110 is placed on top of the chamber body 170. When the test fixture 110 is configured to calibrate a single substrate support, the test fixture 110 need only be configured with test fixture components identified by reference numerals in the drawings having the subscript "a". After calibration, the text fixture 110 is removed and the lid 130 is closed to seal the chamber body 170 for processing substrates.

Figure 3:
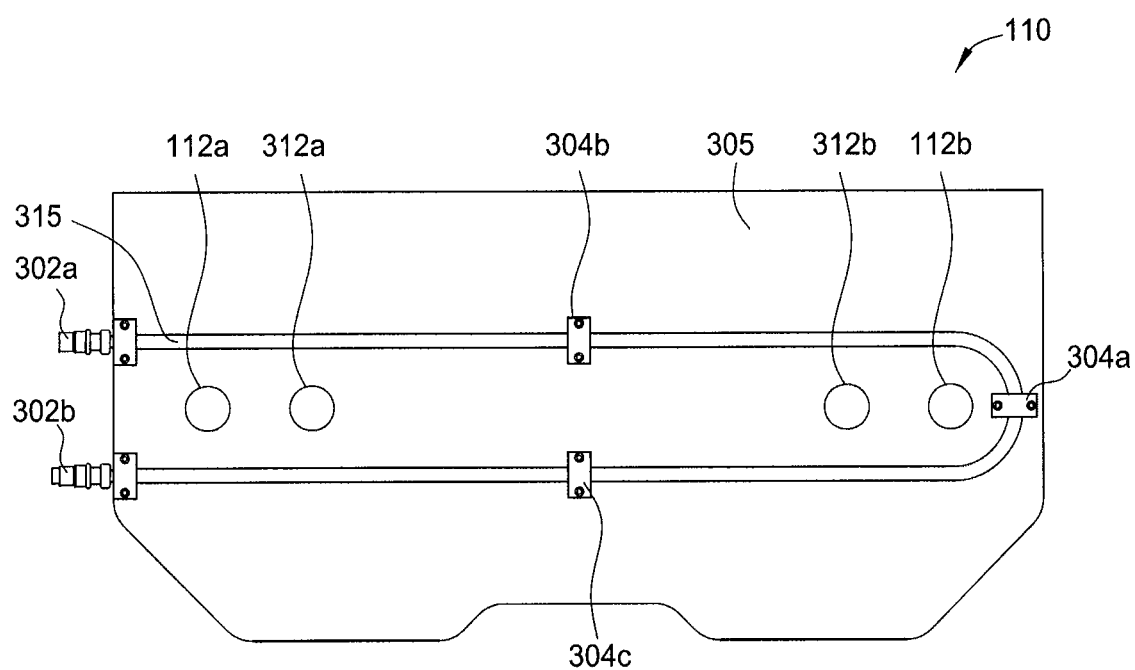
FIG. 3 is a top view of one embodiment of a cover plate of the test fixture.

As shown in FIGS. 2 and 3, the test fixture 110 includes a cover plate 305, at least one cooling channel 315, outer openings 112a, and 112b as well as two non-contact temperature sensors 120a, 120b. The non-contact temperature sensors 120a, 120b may be an infrared thermometer, a pyrometer, an infrared scanning system, an infrared thermal imaging camera and the like. In one embodiment, the non-contact temperature sensors 120a, 120b are pyrometers.

The cover plate 305 of the test fixture 110 is fabricated from aluminum or other suitable material. The cover plate 305 may have a thickness between 0.5-0.75 inches. The outer openings 112a, 112b are formed through the cover plate 305 and are located above the respective annular outer zones 152a, 152b of the substrate supports 150a, 150b. Optionally, the cover plate 305 may include at least two inner openings 312a, 312b formed through the cover plate 305 that are aligned with the inner zones 154a, 154b of the substrate supports 150a, 150b. The outer openings 112a, 112b are utilized to allow the respective non-contact temperature sensors 120a, 120b to detect the temperature in the outer zones 152a, 152b of the substrate supports 150a, 150b through the cover plate 305 during the calibration process. The inner openings 312a, 312b may be utilized to allow the non-contact temperature sensors 120a, 120b to be positioned over the thermocouples 157a, 157b embedded in the respective inner zones 154a and 154b to verify the temperature measurements obtained by the non-contact temperature sensors 120a, 120b. Quartz windows 118a, 118b may be disposed in the openings 112a, 112b. The quartz windows 118a, 118b are transmissive to the radiation emitted by the substrate supports 150a, 150b so that the temperature of the substrate supports 150a, 150b may be measured by the non-contact temperature sensors 120a, 120b.

The non-contact temperature sensors 120a, 120b are mounted over the respective outer openings 112a, 112b of the cover plate 305. The brackets 114a, 114b attached to the cover plate 305 and non-contact temperature sensors 120a, 120b are utilized to space the non-contact temperature sensors 120a, 120b on top of the substrate supports 150a, 150b. In the embodiment where the non-contact temperature sensors 120a, 120b are pyrometers, the brackets 114a, 114b space the non-contact temperature sensors 120a, 120b from the top of the substrate supports 150a, 150b by a distance that is commensurate with the focal length of the pyrometer for accurate and reliable measurement of the temperature of the substrate support. Clamps, screws or other securing mechanisms may be further used to hold the non-contact temperature sensors 120a, 120b to the brackets 114a, 114b. When secured, the non-contact temperature sensors 120a, 120b have a respective field of view 122a, 122b through the respective quartz window 118a, 118b to an area of each of the substrate supports 150a, 150b that is adjacent to the respective resistive coils 155a, 155b. The non-contact temperature sensors 120a, 120b are configured to obtain temperature measurements of the respective area over each of the substrate supports 150a, 150b and transmit the information to the controller 140 via the connecting wires 124a and 124b. In the embodiment shown, the non-contact temperature sensors 120a, 120b may be a Lumasense® IGA 6-23 MB10 pyrometer. The non-contact temperature sensors 120a, 120b can measure temperatures over a wide range, for example, between about 50 and 1000 degrees Celsius and has a focal length between about 210 to 5000 mm.

The cooling channel 315 keeps the cover plate 305 from overheating due to the heat generated by the substrate supports 150a, 150b. In one example, the cooling channel 315 is fabricated from stainless steel tubing and is set in a groove formed in the cover place 305. A potting compound (not shown) is used to fill the groove around the stainless steel tubing to ensure efficient cooling of the cover plate 305. A plurality of tabs 304a, 304b and 304c are coupled to the cover plate 305 over the cooling channel 315 to retain the cooling channel 315 within the groove formed in the cover plate 305. In alternative embodiments, the tabs may be replaced by other securing mechanisms. Fittings 302a and 302b are coupled to the inlet and outlet of the cooling channel 315 to facilitate easy connection to a heat transfer fluid source (not shown) for circulating a heat transfer fluid, such as water, within the cooling channel 315 to control the temperature of the cover plate 305.

The test fixture 110 includes a plurality of handles 116 so that the test fixture 110 can be easily placed over the chamber body 170 and removed after the calibration has been performed. A plastic cover 160 may be disposed over the top of the cover plate 305 to avoid exposure of potentially hot surfaces of the cover plate 305. The plastic cover 160 also prevents the loss of heat through the inner openings 312a and 312b, as the lid 130 would during operation of the processing chamber 100, thus helping the non-contact temperature sensors 120a, 120b reliably measure the temperature of the substrate supports 150a, 150b.

The test fixture 110 is used for calibrating measurements of temperature of the substrate supports 150a, 150b utilizing the resistive coils 155a, 155b without contact with the surface of the substrate support. Initially, the lid 130 of the processing chamber 100 is moved to an open state to accommodate the test fixture 110 on the upper surface of the chamber body 170. The cover plate 305 of the test fixture 110 acts as the lid of the processing chamber 100 during the calibration process. The cover plate 305 includes an interlock (not shown) that engages a sensor coupled to the chamber body 170 to simulate the closure of lid 130 to enable operation of the processing chamber 100. The non-contact temperature sensors 120a, 120b are mounted above the outer openings 112a, 112b of the test fixture 100 by the brackets 114a, 114b such that the distance between the substrate supports 150a, 150b and the non-contact temperature sensors 120a, 120b is substantially equal to the focal length of the non-contact temperature sensors. The non-contact temperature sensors 120a, 120b have respective fields of view 122a, 122b that focus on an area adjacent to the respective resistive coils 155a, 155b of the respective substrate supports 150a, 150b. Ohm-meters 159a, 159b are each connected to the respective resistive coils 155a, 155b to directly measure the resistance of the resistive coil as the resistance varies proportionately to the temperature of the substrate supports 150a, 150b.

Both the substrate supports 150a, 150b disposed in the processing chamber 100 can be calibrated at the same time. In one example of the calibration process of the first substrate support 150a, the substrate support 150a is heated to 550° C. in 50° C. increments. Several calibration temperature measurements, $t_1, t_2, \ldots, t_N$, of the outer zone 152a of the substrate support 150a are taken using the non-contact temperature sensor 120a at each temperature increment. At the same time, several calibration resistance measurements, $r_1, r_2, \ldots, r_N$, of the resistive coil 155a are taken corresponding to each calibration temperature measurement. At each temperature, the relationship between the measured calibration temperature of the substrate support 150a and the measured calibration resistance of the resistive coil 155a is determined. A plurality of resistance parameters, $k_1, k_2, \ldots, k_N$, each representing the relationship at each temperature is determined as the product of the calibration process. A final resistance parameter, k may be determined as the slope of the linear best fit line that defines the relationship over a temperature range. This relationship between a measured resistance of the resistive coil 155a, and the temperature of the substrate support 150a, T corresponding to the measured resistance of the resistive coil 155a may be defined as:

$$T=k*f(R) \quad \text{(i)}$$

where 'k' is the slope of the linear best fit line through the points $t_1, t_2, \ldots, t_N$, and, $r_1, r_2, \ldots, r_N$, plotted on an X-Y Cartesian coordinate plane; and 'f' represents the relationship such that the temperature T of the substrate support 150a can be determined from a measured resistance, R, of the resistive coil 155a disposed within the substrate support 150a.

The temperature of the outer zone 152b of the substrate support 150b is also calibrated simultaneously using this same process by taking measurements with non-contact temperature sensor 120b. For verification, the temperature of the substrate support 150a is increased relative to the substrate support 150b to infer which of the non-contact temperature sensors 120a, 120b is associated with the substrate supports 150a, 150b in case the connections of non-contact temperature sensors 120a, 120b to the controller 140 were swapped. During the calibration process, the temperature of the outer zones 152a, 152b of the substrate supports 150a, 150b are maintained within 10 degrees Celsius hotter and 30 degrees Celsius colder than the inner zones 154a, 154b to prevent cracking of the substrate supports. After calibration, the test fixture 110 is removed from the chamber body 110 and the lid 130 of the processing chamber 100 is closed.

During the subsequent processing of substrates on the substrate supports 150a, 150b in the processing chamber 100, the temperature of the outer zones 152a, 152b of the substrate support 150a, 150b (and hence the outer area of the substrates thereon) can be determined from the known final resistance parameter, k and the relationship (i) above between the measured resistance of the resistive coils 155a, 155b, and the temperature corresponding to the measured resistance of the resistive coils 155a, 155b.

Figure 4:
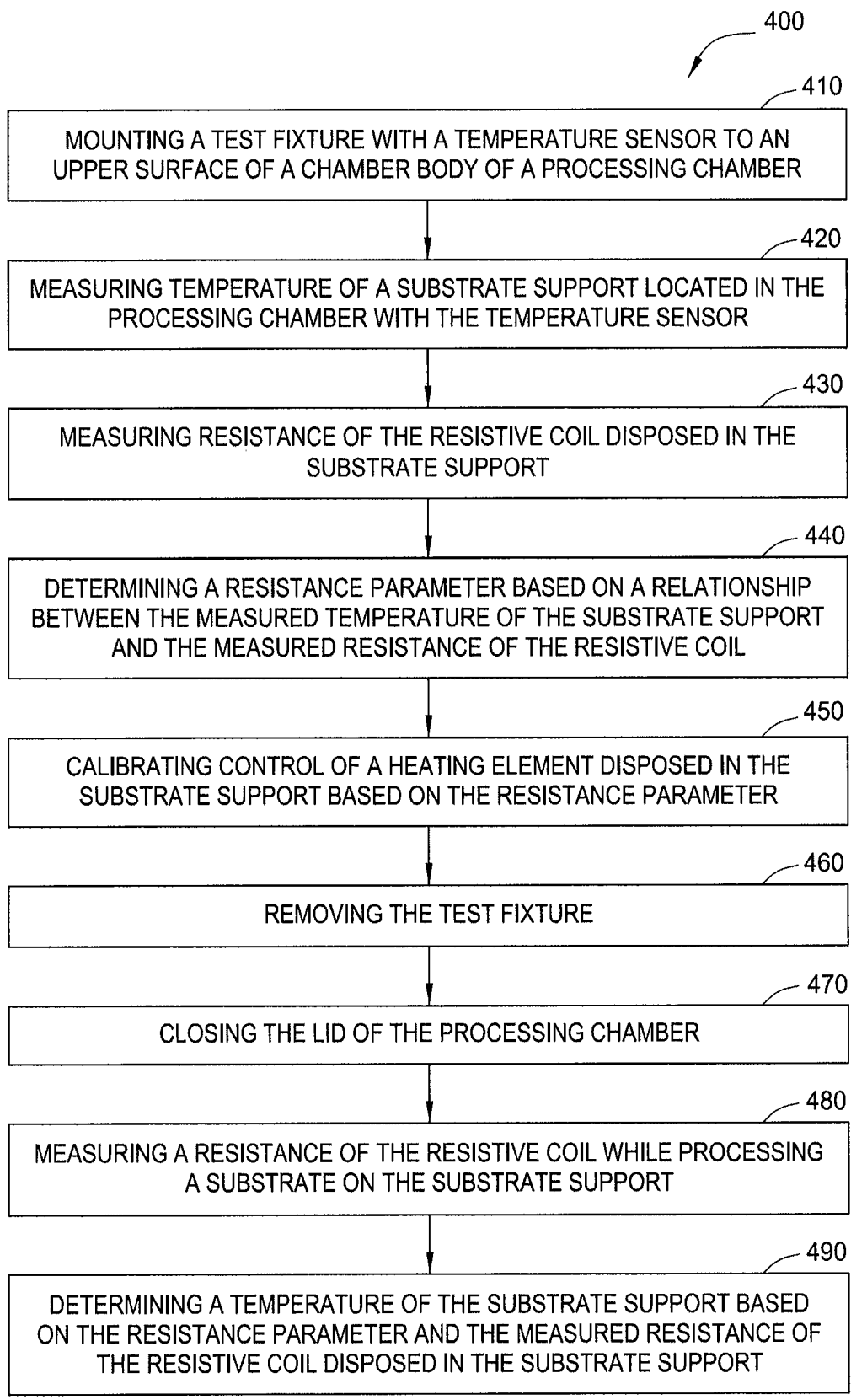
FIG. 4 is a flow diagram of a method for measuring temperature of a substrate support in a processing chamber without contact with a surface of the substrate support.

FIG. 4 is a flow diagram for a method 400 for measuring temperature of a substrate support in a processing chamber without contact with the surface of the substrate support, according to another embodiment of the disclosure. The method 400 begins at block 410 by mounting a test fixture having a temperature sensor on an upper surface of a chamber body of a processing chamber. In one example, a test fixture 110 is mounted on the upper surface of the chamber body 170 of a processing chamber 100. The test fixture 110 has a non-contact temperature sensor 120a installed thereon in such a way that the non-contact temperature sensor 120a has a field of view covering an area of substrate support 150a that is adjacent to the resistive coil 155a embedded within the substrate support 150a, i.e., the area of the outer zone 152a.

At block 420, the temperature sensor is used to measure the calibration temperature of a substrate support located in the processing chamber. In the example described above, the non-contact temperature sensor 120a is used to measure the calibration temperature of the substrate support 150a in the outer zone 152a. The calibration temperature, T, is measured from radiation emitted by the substrate support 150a being heated by the heating element 151a that passes through the quartz window 118a and reaches the sensory end of the non-contact temperature sensor 120a.

At block 430, the calibration resistance of a resistive coil disposed in the outer zone of substrate support is measured by an ohm-meter. In the example described above, the calibration resistance, R, of the resistive coil 155a disposed in the outer zone 152a of the substrate support 150a is measured using the ohm-meter 159a connected to the resistive coil 155a. The calibration resistance measurements are taken at the same time as the calibration temperature measurements taken by the non-contact temperature sensor 120a.

At block 440, a resistance parameter is determined based on a relationship between the measured calibration temperature of the outer zone of the substrate support and the measured calibration resistance of the resistive coil. In the example described above, the relationship between the measured calibration temperature of the outer zone 152a of the substrate support 150a and the measured calibration resistance of the resistive coil 155a is determined at each temperature. A plurality of resistance parameters, $k_1, k_2, \ldots, k_N$, each representing the relationship at each of the temperature measurement is determined as the product of the calibration process. A final resistance parameter, k is determined as the slope of the linear best fit line that defines the relationship between the measured calibration temperature and calibration resistance measurements over the temperature range. The determination of the temperature $T_i$ of the outer zone 152a of the substrate support 150a is subsequently enabled by this known final resistance parameter, k and the relationship (i) between the measured resistance, $R_i$, of the resistive coil 155a and the temperature corresponding to the measured resistance of the resistive coils 155a.

At block 450, temperature control of a heating element disposed in the substrate support is calibrated based on the resistance parameter. In the example described above, the control of the heating element 151a disposed in the outer zone 152a of the substrate support 150a is calibrated based on the final resistance parameter, k.

At block 460, the test fixture is removed. In the example described above, the test fixture 110 is removed from the chamber body 170 by using the handles 116.

At block 470, the lid of the processing chamber is closed to begin processing of substrates. In the example above, the lid 130 is closed upon the chamber body 170 so that the processing chamber 100 is ready for processing. The method 400 as outlined in blocks 410-450 is used to calibrate the measurement of temperature of the substrate support, for example, the substrate support 150a and any substrate placed on it during processing.

At block 480, the resistance of a resistive coil disposed in the outer zone substrate support is measured during processing of a substrate placed on the substrate support. In the example described above, the resistance of the resistive coil 155a disposed in the substrate support 150a is measured, as $R_a$, using an ohm-meter.

At block 490, the temperature of the outer zone of the substrate support is determined based on the final resistance parameter, k, and the measured resistance of the resistive coil disposed in the outer zone of the substrate support. In the example described above, the temperature, $T_i$, of the outer zone 152a of the substrate support 150a and the substrate placed on it can be determined from the measured of the resistive coil 155a and the final resistance parameter, k. The measured resistance $R_i$ is used in the relationship (i) between the measured resistance R of the resistive coil 155a and the temperature T corresponding to the measured resistance of the resistive coils 155a, such that:

$$T_i = k * f(R_i) \tag{ii}$$

Figure 5:
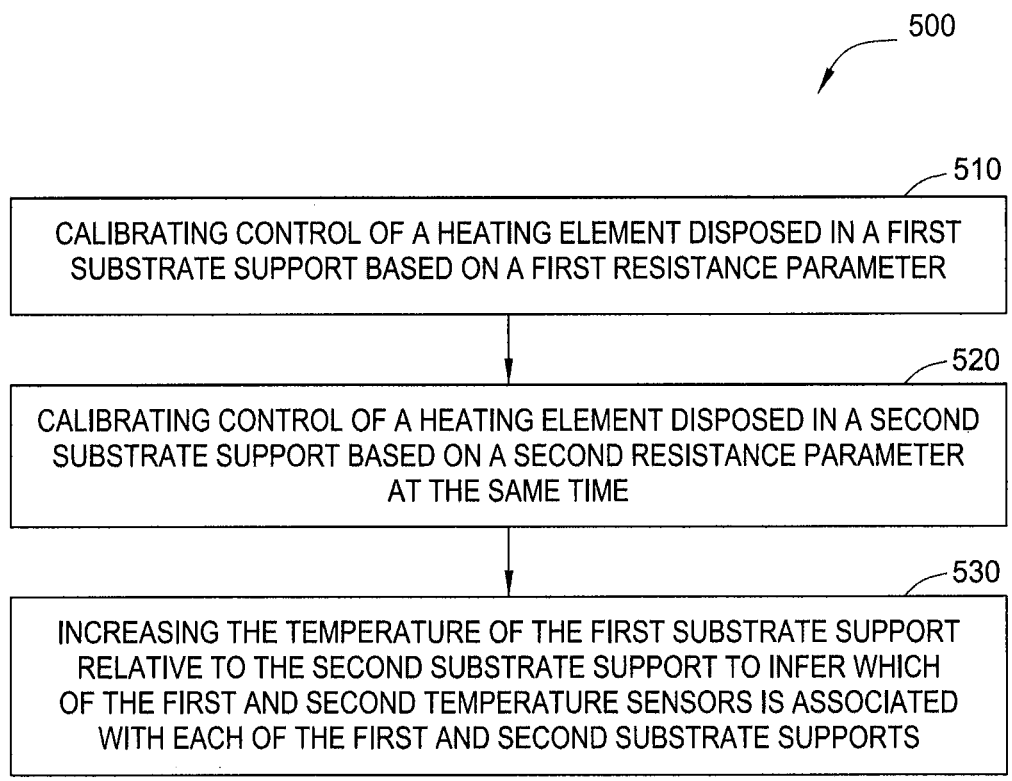
FIG. 5 is a flow diagram of a method for simultaneously measuring temperature of two substrate supports disposed in a processing chamber.

FIG. 5 is a flow diagram of a method for calibrating measurements of temperature of two substrate supports simultaneously in a processing chamber.

At block 510, control of a first heating element disposed in a first substrate support is calibrated based on a first resistance parameter, using the method 400 as outlined in blocks 410-450 of the flow diagram of FIG. 4. In the example described above, the heating element 151a of substrate support 150a is calibrated based on a first resistance parameter, $k_a$, using the non-contact temperature sensor 120a and the method 400 as outlined in blocks 410-450 of the flow diagram of FIG. 4.

At block 520, control of a second heating element disposed in a second substrate support is calibrated based on a second resistance parameter, using the method 400 as outlined in blocks 410-450 of the flow diagram of FIG. 4. In the example described above, the heating element 151b of substrate support 150b is calibrated based on a second resistance parameter, $k_b$, using the non-contact temperature sensor 120b and the method 400 as outlined in blocks 410-450 of the flow diagram of FIG. 4.

At block 530, the temperature of the first substrate support is increased relative to the second substrate support to infer which of the first and second temperature sensors is associated with the first and second substrate supports. In the example described above, the temperature of the substrate support 150a is increased relative to the substrate support 150b to infer which of the non-contact temperature sensors 120a, 120b is associated with each of the substrate supports 150a, 150b.

The methods and test fixture described in this disclosure provide an improved way of calibrating the heating elements of a substrate support accurately and without contact with the surface of a substrate or the substrate support. The improvement is enabled by the use of temperature sensors, specifically non-contact temperature sensors that can measure the temperature of a substrate or the substrate support without contacting the surface thereof. The lack of contact removes the risk of metal contamination in the processing chamber. Additionally, since the non-contact temperature sensors can reliably and accurately measure the temperature over a wide range with precision of ±2 degrees Celsius, the substrate supports can be calibrated to desirable temperature accuracy.

While the foregoing is directed to particular embodiments of the present disclosure, it is to be understood that these embodiments are merely illustrative of the principles and applications of the present invention. It is therefore to be understood that numerous modifications may be made to the illustrative embodiments to arrive at other embodiments without departing from the spirit and scope of the present inventions, as defined by the appended claims.

What is claimed is:

1. A test fixture for measuring temperature in a processing chamber, comprising:
   a cover plate sized to cover an upper surface of a chamber body of the processing chamber when a lid of the processing chamber is open;
   one or more cooling channels thermally contacting the cover plate;
   a first opening and a second opening formed through the cover plate;
   a first non-contact temperature sensor mounted over the first opening and a second non-contact temperature sensor mounted over the second opening, the first and the second non-contact temperature sensor connectable to a controller via wires and configured to measure temperature of surfaces below the cover plate through the openings of the cover plate;
   a first bracket spacing the first non-contact temperature sensor above the first opening and a second bracket spacing the second non-contact temperature sensor above the second opening;
   a plastic cover disposed over the cover plate; and
   a plurality of handles, each handle of the plurality of handles disposed adjacent edges of the cover plate.

2. The test fixture of claim 1, wherein the cover plate comprises aluminum.

3. The test fixture of claim 1, wherein each of the first opening and the second opening further comprises:
   a quartz window.

4. The test fixture of claim 1, wherein the first non-contact temperature sensor and the second non-contact temperature sensor are pyrometers.

5. The test fixture of claim 1, wherein the cover plate has a thickness of about 0.5 to about 0.75 inches.

6. The test fixture of claim 1, wherein the one or more cooling channels comprise stainless steel.

7. The test fixture of claim 1, wherein the one or more cooling channels are set in a groove formed in the cover plate.

8. The test fixture of claim 7, further comprising:
   a potting compound at least partially filling the groove.

9. The test fixture of claim 1, further comprising a plurality of tabs coupled to the cover plate over the one or more cooling channels.

10. A test fixture for measuring temperature in a processing chamber, comprising:
    a cover plate having a thickness of about 0.5 inches to about 0.75 inches;
    one or more cooling channels thermally contacting the cover plate;
    a first opening and a second opening formed through the cover plate;
    a first non-contact temperature sensor mounted over the first opening and a second non-contact temperature sensor mounted over the second opening, both the first non-contact temperature sensor and the second non-contact temperature sensor connectable to a controller via connecting wires;
    a plastic cover disposed over a top of the cover plate;
    a first bracket spacing the first non-contact temperature sensor above the first opening and a second bracket spacing the second non-contact temperature sensor above the second opening; and
    a plurality of handles, each handle of the plurality of handles disposed adjacent edges of the cover plate.

* * * * *